United States Patent [19]

Forster et al.

[11] Patent Number: 4,560,933
[45] Date of Patent: Dec. 24, 1985

[54] APPARATUS FOR ADJUSTABLY MOUNTING COILS OF A MAGNET SYSTEM FOR NUCLEAR SPIN TOMOGRAPHY

[75] Inventors: Helmut Forster, Neunkirchen; Horst Siebold, Erlangen; Karl-Georg Heinzelmann, Neunkirchen, all of Fed. Rep. of Germany

[73] Assignee: Siemens Aktiengesellschaft, Munich, Fed. Rep. of Germany

[21] Appl. No.: 516,249

[22] Filed: Jul. 22, 1983

[30] Foreign Application Priority Data

Jul. 26, 1982 [DE] Fed. Rep. of Germany ....... 3227844

[51] Int. Cl.[4] ........................................... G01R 33/08
[52] U.S. Cl. ..................................... 324/319; 336/65
[58] Field of Search ................ 324/318, 319; 335/216, 335/299; 336/65

[56] References Cited

U.S. PATENT DOCUMENTS

| 2,947,920 | 8/1960 | Hall | 324/319 |
| 3,418,538 | 12/1968 | Roman | 324/319 |
| 4,315,216 | 2/1982 | Clow et al. | 324/309 |

FOREIGN PATENT DOCUMENTS

1330331 9/1973 United Kingdom ................ 324/319

OTHER PUBLICATIONS

Double, "Manual Field Adjustment for NMR Magnet", IBM Technical Disclosure Bulletin, vol. 20, No. 4, Sep. 1977.
P. C. Lauterbur, "Image Formation by Induced Local Interactions: Examples Employing Nuclear Magnetic Resonance", Nature, vol. 242, pp. 190–191, Mar. 6, 1973.
A. Ganssen et al., "Kernspin-Tomographie" (Nuclear Spin Tomographic), Computertomographic (Computer Tomography), vol. 1, pp. 2–10, 1981.

Primary Examiner—Ernest F. Karlsen
Assistant Examiner—Kevin D. O'Shea
Attorney, Agent, or Firm—Kenyon & Kenyon

[57] ABSTRACT

An adjusting and holding assembly for magnet coils in a nuclear spin tomography system includes mechanical adjusting devices connected to a frame structure for the mutual alignment of the connected to a frame structure for the mutual alignment of the base field magnet coils. In order to enable a relatively simple adjustment of the individual magnet coils to produce a highly homogeneous base field, at least one of the magnet coils is rigidly connected to the frame structure, while each adjustable or positionable magnet coil is held at three points via at least one support device and three adjusting devices within the frame structure. Each support device comprises a support element in the form of a spherical sector rotatably mounted to a respective coil and slidably resting on a horizontal support surface of the frame structure. The support points of the adjustable magnet coils are longitudinally spaced from the center of gravity line of the respective magnet coil so that an additional tilting force is brought about.

20 Claims, 3 Drawing Figures

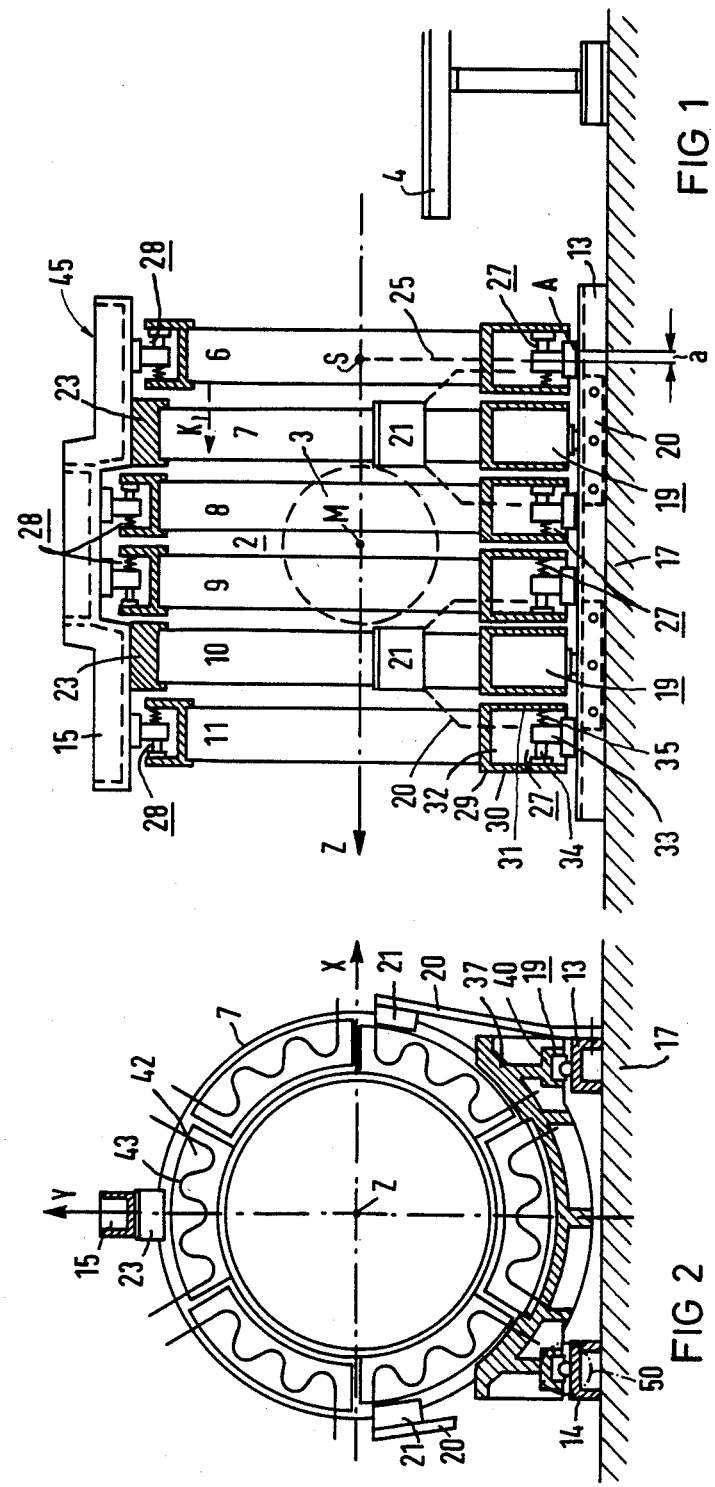

APPARATUS FOR ADJUSTABLY MOUNTING COILS OF A MAGNET SYSTEM FOR NUCLEAR SPIN TOMOGRAPHY

BACKGROUND OF THE INVENTION

This invention relates to apparatus for the spatial adjustment and holding of individual magnet coils which are lined up one behind the other on a common axis and serve to generate a homogeneous magnetic base field of a facility for nuclear spin tomography, the positions and orientations of the magnet coils being adjustable by means of mechanical adjusting devices which are connected to stationary parts of a frame structure. Such an adjusting and holding apparatus is known, for instance, from U.S. Pat. No. 4,315,216.

In the field of medical diagnostics, image-displaying methods have been developed, in which an image similar to an x-ray tomogram is constructed by numerical analysis or measurement of integral resonance signals of nuclei such as protons from the spatial spin density and/or relaxation time distribution of a body to be examined. This method is also called zeugmatography ("Nature", Vol. 242, 1973, pages 190 and 191).

Since, as is well known, the nuclear resonance signal increases with increasing magnetic base field, a base field which is as strong as possible and which has sufficient homogeneity in a measuring range is desired for nuclear spin tomography apparatus. On this base field, stationary and/or pulsed gradient fields are superimposed. In addition, a high-frequency field oriented perpendicularly to the base field must be provided. The dimensions of the respective magnet coils must be matched to the dimensions of the body to be examined in such a way that the latter can be inserted without difficulty into the measuring region surrounded by the coils.

U.S. Pat. No. 4,315,216 discloses a magnet system for generating a base field, which system comprises four ring-shaped magnet coils which are aligned along a common horizontal axis. Since, as is well known, the homogeneity of the field of these coils must meet stringent requirements and should not vary, for instance, more than 0.01% of the magnetic field strength in the entire measuring volume, the positions and orientations of individual coils of the magnet system must be finely adjustable. Such adjustability is necessary even in cases of the highest manufacturing precision with respect to the magnet coils in order to compensate, for instance, the influence of iron parts in the vicinity of the magnet system. Each of the four magnet coils has maximally three degrees of freedom of translation and two degrees of freedom of rotation. Accordingly, a number of devices must be provided for mutually aligning the individual magnet coils. In this magnet system, all four adjustable magnet coils are supported on a common base plate. At one end face of each of the magnet coils are fastened four circumferentially equispaced plate-shaped elements which project radially outwardly. Corresponding plate-shaped elements of the four magnet coils are connected to each other via a common threaded rod. The axial positions and angular orientations of the individual coils within the frame structure are precisely determined by adjusting fastening nuts, by which plate-shaped elements of the coils are secured to the respective threaded rods. Furthermore, the individual magnet coils of the known magnet system can be aligned in the vertical direction via adjusting devices engaging the base plate (see FIGS. 4a and 4b of the above-identified patent). In this known magnet system, the expenditure for adjustment is relatively large since five adjusting devices are provided for each magnet coil. Furthermore, because the individual magnet coils are connected to each other via the threaded rods, thermal length changes and vibrations of these coils lead to a de-adjustment of the entire system and thus to a corresponding degradation of the homogeneity of the magnetic base field. Readjustment is relatively difficult in this case.

It is an object of this invention to provide an improved adjusting and holding apparatus of the above-described type, in which a relatively simple adjustment of the individual magnet coils is possible and, at the same time, a high homogeneity of the magnetic base field can be achieved.

SUMMARY OF THE INVENTION

According to the present invention, this object is attained by the provisions:

(a) that at least one magnet coil in the base field array is rigidly connected to the frame structure, (b) that each adjustable magnet coil is held at three points via at least one support device for transmitting the weight of the magnet coil to the frame structure and three setting devices within the frame structure, (c) that each support device contains a support element in the form of a spherical sector with a spherical surface rotatably inserted in a recess of the support device fixed with respect to the respective magnet coil and with a flat side slidably resting on horizontal support surface of the frame structure, and (d) that the support points of the adjustable magnet coils are spaced from transversely oriented center of gravity planes of the respective magnet coils in such a manner that a tilting force on each magnet coil is created in the direction toward the center of the magnet system.

The present invention arises from the insight that, with respect to one coil, two degrees of freedom of translatory motions, namely the height adjustment and the lateral displacement, need not be taken into consideration while the manufacturing tolerances are narrowed down, since the magnetic effect of such translations can also be generated by rotations of the coil. In the totality of the degrees of freedom of all coils, the translation of the entire magnet system and the two angles of the magnetic axis in space can be dispensed with, because the homogeneity of the magnetic field is not influenced thereby. Thus, essentially only one adjustment at each of three support points is necessary for the individual magnet coils. Furthermore, since at least one of the magnet coils is rigidly connected to the frame structure, its stiffness is correspondingly great. Through the provision of support elements in the form of spherical sectors, tilting the adjustable magnet coils and displacement in the direction of the common axis is greatly facilitated. Due to the predetermined dispositions of the spherical sectors relative to the centers of gravity of the coils, a tilting force is additionally generated, which can advantageously be utilized for increasing the supporting force on the setting or adjusting devices, particularly in the nonexcited or de-energized state of the magnet system. The structure is therefore largely insensitive to vibrations, thermal length changes as well as mechanical play.

A positioning and mounting apparatus according to the present invention is particularly advantageous in a magnet system with at least five magnet coils. The adjusting effort, particularly the minimum distance adjustment of each setting device is then relatively small. The magnet system can preferably comprise six magnet coils, where the two magnet coils at the end face and the two innermost magnet coils are adjustable. With such a system, the manufacturing tolerances of the individual magnet coils can be corrected without limit by mechanical displacements alone.

BRIEF DESCRIPTION OF THE DRAWING

FIG. 1 is a partially schematic longitudinal cross-sectional view of a magnet array in a nuclear spin tomography system, showing a mounting apparatus with mechanical position adjusters in accordance with the present invention.

FIG. 2 is a partially schematic transverse cross-sectional view of the magnet array of FIG. 1, showing the mounting apparatus with support elements in accordance with this invention.

FIG. 3 is a detail view, on an enlarged scale, of a pair of coacting support elements shown in FIG. 2.

DETAILED DESCRIPTION

As illustrated in FIG. 1, an array 2 of magnet coils 6, 7, 8, 9, 10 and 11 for generating a magnetic base field in a system for nuclear spin tomography or zeugmatography is coaxially arranged with respect to the horizontally oriented z axis of an orthogonal x-y-z coordinate system. The base field generated by the coils of array 2 must attain a sufficient degree of homogeneity in a field region 3 centered at the origin M of the orthogonal coordinate axes. As described in such publications as "Computer Tomography", Vol. 1 (1981), pages 2 to 10, the nuclear spin tomography system further includes gradient coils (not shown in the drawing) for generating sufficiently constant magnetic field gradients in field region 3. The nuclear spin of selected atoms in a sample, e.g., hydrogen nuclei of water molecules, is excited by means of a high-frequency magnetic field generated perpendicularly to the z axis by nonillustrated coils which can also serve as receiver coils for detecting nuclear spin resonance signals. The entire magnet coil arrangement, and in particular base field magnet array 2, permits axial access to the homogenous field region 3, so that a body to be examined, for instance a human body, can be inserted into the magnetic field, for instance, on a litter 4 shiftable along the z axis.

The base field magnet array 2 comprises advantageously six annular magnet coils 6 to 11 which are aligned with each other along the z axis. Two of these magnet coils, preferably coils 7 and 10 which are adjacent to magnet coils 6 and 11 at the ends of array 2 are rigidly connected to a frame structure 45 which comprises two support bars 13 and 14 and a holding bar 15, as shown in FIG. 2. Support bars 13 and 14 rest on a substructure 17. Magnet coils 7 and 10 are held up via support devices 19 (not shown in detail) resting on the lower bars and are fixed to these bars by metal sheets 20, so-called gusset plates. Gusset plates 20 engage magnet coils 7 and 10 laterally via tabs 21 and are bolted to support bars 13 and 14. Stationary magnet coils 7 and 10 are each rigidly connected to holding bar 15 via a claw-like fastening element 23. Support bars 13 and 14 as well as holding bar 15 thus form, together with the magnet coils 7 and 10, the rigid frame structure 45 in which the remaining magnet coils 6, 8, 9 and 11 are arranged adjustably by devices according to the present invention.

These devices include mechanical setting devices 27 and 28 (see FIG. 1) for the mutual alignment of the magnet coils and support devices 19 which are illustrated in greater detail in FIG. 2. These support devices 19 define support points A at which weight is transferred from the adjustably positionable magnet coils 6, 8, 9 and 11 to support bars 13 and 14. In accordance with this invention, each positionable magnet coil has two support devices 19 and, consequently, two support points A, these support points being spaced by a predetermined distance a in the z direction from a transversely center of gravity plane 25 (see FIG. 1) defined by the center of gravity S of the respective magnet coil. The center of gravity planes are substantially parallel to the windings of the respective positionable magnet coils 6, 8, 9 and 11 and approximately perpendicular to the common axis, i.e., the z axis, of the magnet array, while the support points are located on sides of the center of gravity planes opposite the geometrical center of the magnet array—which center is coordinate system origin M in the array of FIG. 1. The eccentric disposition of the support points A of a magnet coil, e.g., coil 6, gives rise to a mechanical couple, represented by designation K, tending to rotate the respective magnet coil about the x axis, i.e., tending to move the top of the coil towards the geometrical center M.

The support points A of the adjustable magnet coils 6, 8, 9 and 11 at support bars 13 and 14 as well as the tilting of these magnet coils with respect to the x-y plane due to mechanical couple K can be adjusted by setting or adjusting devices 27 and 28. Each positionable magnet coil 6, 8, 9 and 11 has two position setting devices 27 at support bars 13 and 14 and a third setting device 28 at holding or bracing bar 15. Setting devices 27 are juxtaposed to respective support devices 19 and are connected to a channel-shaped hollow profile body 29 which is open toward the bottom and which is fastened to the lower outside edge of the respective adjustable magnet coil, for instance, coil 11, in the vicinity of a support point. A support part or bracing projection 33 fastened to the support bar 13 (or 14) extends vertically into a space 32 within this hollow profiled body 29 between two free legs 30 and 31 thereof. The position of legs 30 and 31 of body or channel 29 and, therefore, of the magnet coil 11 relative to projection 33 is modifiable via an adjusting spindle 34 which extends substantially in the z direction and which is connected to outer leg 30, i.e., to the channel leg which is further away from the geometrical center M of magnet array 2, and is supported at one end by projection 33. Between this brace or projection 33 and the other free leg 31 of channel 29 a spring element 35 is clamped. This spring element 35 pushes the magnet coil, in the de-energized state of the magnet system, against adjusting spindle 34. Therefore, there is always a force-locking connection from each positionable magnet coil 6, 8, 9 and 11 via the two respective adjusting spindles 34 to the support bars 13 and 14.

In a similar manner, adjustable magnet coils 6, 8, 9 and 11 are connected to holding bar 15 via upper setting devices 28. Mechanical couple or tilting force K serves here to increase the support forces acting on the adjusting spindles 34.

In FIGS. 2 and 3, the support of the magnet coils of the magnet system at three points within frame structure 45 is shown in detail. While in these figures, the front view onto one of the magnet coils rigidly connected to the frame structure, for instance, onto the magnet coil 7 according to FIG. 1 is shown, the support is similar for the adjustable coils.

Magnet coil 7 is fastened at its underside to a carrier body 37 such as a prism or a yoke shell. Upon receiving the coil, shell 37 is filled with a casting resin compound with a tight fit. Yoke shell 37 is provided with two support devices 19 which transfer the weight of the magnet coil to the two support bars 13 and 14, these bars resting on substructure 17 and extending in the z direction. FIG. 3 illustrates on an enlarged scale the essential part of the support device associated with support bar 14 and shown in a portion of FIG. 2 defined by a dot-dash circle 50. This support device contains a support element 38 in the form of a spherical sector having a planar surface or flat side 46 slidably engaging a horizontal upper surface 47 of support bar 14. This support element also has a convex spherical surface 48 slidably or rotatably engaging a concave spherical surface of a recess 39 of a support element 40 which is connected rigidly to yoke shell 37.

FIG. 2 shows gusset plates 20 and fastening tabs 21 via which magnet coil 7 is rigidly connected to support bars 13 and 14. Magnet coil 7 is further fastened to holding bar 15 via claw-shaped fastening element 23. In the case of the adjustable magnet coils, the gusset plates and the fastening claws are eliminated, and fastening elements 23 are replaced by adjusting devices 28, by which the magnet coils can be tilted slightly.

In FIG. 2 are further indicated cooling segments 42 with cooling coils 33 which serve to remove the heat generated in the normal conducting magnet winding at the end face of the magnet coil.

As alternatives to the above-described methods of supporting and fastening of magnet coils 7 and 10 to support bars 13 and 14, other known connecting techniques can be used to ensure a load-carrying rigid connection between magnet coils 7 and 10 and the support bars. All parts of a position adjusting and weight carrying device according to this invention, as well as support bars 13 and 14 and holding bar 15, are advantageously made of nonmagnetic material such as aluminum in order to preclude an impairment of the homogeneity of the magnetic field.

The three adjusting devices 27 and 28 connected to each magnet coil of the apparatus according to this invention are sufficient to achieve a relatively high field homogeneity of $\pm 20$ ppm with correction steps of less than $\pm 100$ $\mu$m which can be executed programmed, at the adjusting devices. Adjusting or positioning devices according to the present invention can be provided for magnet systems which are composed of four or five individual magnet coils. In these magnet systems, however, the required adjusting effort is accordingly higher. In particular, displacements to be provided at the adjusting devices are larger; moreover requirements as to manufacturing tolerances of the individual magnet coils are higher in order to obtain the above-stated field homogeneity.

Due to the support of magnet coils 6, 8, 9 and 11 according to the present invention via support elements 38 in the form of spherical sectors, the sliding and tilting movements of the individual magnets during adjustment of translational and angular positions can be carried out without jerks and without difficulty, because the coefficient of static friction $\mu$ between the moving parts can be kept sufficiently small. For example, values between 0.05 and 0.1 can be achieved for this coefficient without difficulty.

The devices 19, 27 and 28 for holding and adjusting the magnet coils of a magnet array according to the present invention in a nuclear spin resonance system make simple adjustment of the individual magnet coils possible with relatively low manufacturing costs. In addition, individual coils can be replaced without great effort.

What is claimed is:

1. In a nuclear spin tomography system having n adjustably positionable magnet coils aligned with each other along a common axis for generating a homogeneous magnetic base field, the tomography system including a mounting apparatus with a frame structure and mechanical adjusting devices secured to stationary parts of the frame structure for adjusting the translational and angular positions of the magnet coils with respect to the frame structure, the improvement comprising:

at least one additional magnet coil rigidly connected to the frame structure and aligned with the adjustably positionable magnet coils along the common axis, said adjustably positionable magnet coils each being connected to said frame structure via three of the mechanical adjusting devices, said magnet coils forming an array having a geometrical center, each of said adjustably positionable magnet coils having a center of gravity defining a respective center of gravity plane oriented substantially parallel to the windings of the respective magnet coil and at least approximately perpendicularly to said common axis, and support means included in the mounting apparatus for transmitting the weight of the n adjustably positionable magnet coils to said frame structure, said support means including at least n first support elements each rigidly attached to a respective adjustably positionable magnet coil and each being provided with a concave spherical surface defining a recess, said support means further including at least n second support elements each in the shape of a spherical sector having a planar surface slidably engaging a horizontal surface of said frame structure and a convex spherical surface slidably engaging the concave spherical surface of a respective first support element, the support elements associated with an adjustably positionable magnet coil defining at least one support point at which weight is transferred from the respective magnet coil to the frame structure, said support point being spaced from the center of gravity plane of the respective magnet coil on a side of such plane opposite said geometrical center, thereby giving rise to a mechanical couple operating on the respective magnet coil and tending to shift the top thereof towards said geometrical center.

2. The improvement defined in claim 1 wherein said frame structure includes a pair of lower support bars for receiving the weight of said magnet coils and an upper bracing bar for holding said magnet coils, said support means including n pairs of said first support elements and n pairs of second support elements, each pair of said first support elements and a corresponding pair of said second support elements defining two support points at which the weight of a respective adjustably positionable magnet coil is transferred to said lower support bars, each member of a pair of said second support elements having a planar surface engaging a horizontal surface of a respective one of said horizontal bars.

3. The improvement defined in claim 2 wherein said frame structure, said support elements and the adjusting devices consist of nonmagnetic material.

4. The improvement defined in claim 3 wherein said frame structure is made at least partially of aluminum.

5. The improvement defined in claim 3 wherein said support elements are made at least partially of aluminum.

6. The improvement defined in claim 3 wherein said adjusting devices are made at least partially of aluminum.

7. The improvement defined in claim 3 wherein the three of said adjusting devices connected to a respective adjustably positionable magnet coil are each in turn connected to a respective one of said bars and wherein said adjusting devices each comprise a bracing projection, an adjusting spindle and a spring element, said projection being rigid with one of said bars, said spindle engaging at one end said projection and being operatively linked at an opposite end to the respective magnet coil, said spring element engaging at one end said projection on a side thereof opposite said spindle and being operatively linked at an opposite end to the respective magnet coil.

8. The improvement defined in claim 7 wherein the spindle of at least one adjusting device associated with each adjustably positionable magnet coil of said system braces the respective magnet coil against the mechanical couple operating thereon.

9. The improvement defined in claim 8 wherein n is at least equal to four.

10. The improvement defined in claim 9 wherein n equals four and two additional magnet coils are rigidly secured to said frame structure adjacent respective end coils of said array and are aligned with said adjustably positionable magnet coils along said common axis.

11. The improvement defined in claim 2 wherein the three of said adjusting devices connected to a respective adjustably positionable magnet coil are each in turn connected to a respective one of said bars and wherein said adjusting devices each comprise a bracing projection, an adjusting spindle and a spring element, said projection being rigid with one of said bars, said spindle engaging at one end said projection and being operatively linked at an opposite end to the respective magnet coil, said spring element engaging at one end said projection on a side thereof opposite said spindle and being operatively linked at an opposite end to the respective magnet coil.

12. The improvement defined in claim 11 wherein the spindle of at least one adjusting device associated with each adjustably positionable magnet coil of said system braces the respective magnet coil against the mechanical couple operating thereon.

13. The improvement defined in claim 12 wherein n is at least equal to four.

14. The improvement defined in claim 13 wherein n equals four and two additional magnet coils are rigidly secured to said frame structure adjacent respective end coils of said array and are aligned with said adjustably positionable magnet coils along said common axis.

15. The improvement defined in claim 1 wherein each of said adjusting devices comprises a bracing projection, an adjusting spindle and a spring element, said projection being rigid with said frame structure, said spindle engaging at one end said projection and being operatively linked at an opposite end to the respective magnet coil, said spring element engaging at one end said projection on a side thereof opposite said spindle and being operatively linked at an opposite end to the respective magnet coil.

16. The improvement defined in claim 15 wherein the spindle of at least one adjusting device associated with each adjustably positionable magnet coil of said system braces the respective magnet coil against the mechanical couple operating thereon.

17. The improvement defined in claim 16 wherein n is at least equal to four.

18. The improvement defined in claim 17 wherein n equals four and two additional magnet coils are rigidly secured to said frame structure adjacent respective end coils of said array and are aligned with said adjustably positionable magnet coils along said common axis.

19. The improvement defined in claim 1 wherein said frame structure, said support elements and said adjusting devices consist of nonmagnetic material.

20. The improvement defined in claim 19 wherein at least one component group among the three component groups of said frame structure, said support elements and said adjusting devices consists at least partially of aluminum.

* * * * *